United States Patent
Noguchi et al.

(10) Patent No.: US 6,396,560 B1
(45) Date of Patent: May 28, 2002

(54) METHOD OF PRODUCING LIQUID CRYSTAL DISPLAY PANEL

(75) Inventors: Takashi Noguchi; Setsuo Usui; Hideharu Nakajima, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/667,758

(22) Filed: Sep. 21, 2000

(30) Foreign Application Priority Data

Sep. 22, 1999 (JP) ............................. 11-268803

(51) Int. Cl.[7] ........................... G02F 1/13; H01L 21/20; H01S 3/10; H01S 3/17
(52) U.S. Cl. ..................... 349/187; 438/486; 438/487; 372/24; 372/40; 117/904
(58) Field of Search .................. 349/22, 187; 372/7, 372/24, 40, 43; 438/149, 151, 166, 30, 487, 486; 117/201, 204, 219, 904

(56) References Cited

U.S. PATENT DOCUMENTS

| | | | | |
|---|---|---|---|---|
| 5,413,958 A | * | 5/1995 | Imahashi et al. | 148/DIG. 150 |
| 5,529,951 A | * | 6/1996 | Noguchi et al. | 117/43 |
| 5,815,494 A | * | 9/1998 | Yamazaki et al. | 372/24 |
| 6,080,643 A | * | 6/2000 | Noguchi et al. | 438/487 |

* cited by examiner

Primary Examiner—William I. Sikes
Assistant Examiner—Tarifur R. Chowdhury
(74) Attorney, Agent, or Firm—Sonnenschein, Nath & Rosenthal

(57) ABSTRACT

Disclosed is a method capable of producing, at a high throughput, a large-area FPD such as a liquid crystal display panel or O-ELD having a horizontal scanning circuit portion including a TFT characteristic having a high drive current (a high mobility), and a pixel portion and a vertical scanning circuit portion each of which contains crystal grains excellent in uniformity. The method includes the steps of: irradiating a location, in which a horizontal scanning circuit equivalent portion is to be formed, of an amorphous silicon thin film panel to be crystallized with 10 to 30 shots of a laser beam having a uniform energy density distribution and having a rectangular shape of a long-side larger than a width of the amorphous silicon thin film panel and a short-side larger than a short-side of the horizontal scanning circuit equivalent portion, in a state in which a relative positional relationship between the amorphous silicon thin film panel and the laser beam is fixed; and irradiating a location, in which a vertical scanning circuit portion and a pixel portion are to be formed, of the amorphous silicon thin film panel with the laser beam while moving the laser beam relative to the amorphous silicon thin film panel along the length direction of the amorphous silicon thin film panel.

18 Claims, 3 Drawing Sheets

METHOD OF PRODUCING LIQUID CRYSTAL DISPLAY PANEL

RELATED APPLICATION DATA

The present application claims priority to Japanese Application No. P11-268803 filed Sep. 22, 1999, which application is incorporated herein by reference to the extent permitted by law.

BACKGROUND OF THE INVENTION

The present invention relates to a method of producing a flat panel display (FPD) such as a liquid crystal display panel or O-ELD (organic electroluminescence display), and particularly to a method capable of producing, at a high throughput, a large-area liquid crystal display panel having a horizontal scanning circuit portion including a TFT characteristic having a high drive current (high mobility), and a pixel portion and a vertical scanning circuit portion each of which contains crystal grains excellent in uniformity.

In recent years, FPDs, in particular, liquid crystal display panels have been extensively used as display units for various kinds of electronic equipment. Currently, an active matrix type in which switching of pixels is performed by turning-on/turning-off switching elements formed at respective pixels of a display portion currently ranks as the dominant liquid crystal display panel.

With respect to such an active matrix type FPD such as a liquid crystal display panel, TFTs formed by an amorphous silicon thin film has come to be used as pixel switching elements because the amorphous silicon thin film having a good quality can be uniformly formed on the base of the panel over a large area.

The use of TFTs formed by an amorphous silicon thin film, however, has a problem. Since scanning portions such as a horizontal scanning circuit portion and a vertical scanning circuit portion of a liquid crystal display panel require high speed operation, TFTs used therefor require a TFT characteristic having a high drive current (high mobility). Accordingly, it is undesirable to use TFTs formed by an amorphous silicon thin film, which are low in operational speed, as TFTs of scanning portions of a liquid crystal display panel. To solve such a problem, liquid crystal display panels of a type of making use of an amorphous silicon thin film have been generally configured such that TFTs formed by the amorphous silicon thin film are used as pixel switching elements of a pixel portion, and a horizontal scanning portion and a vertical scanning portion, which are formed by exclusive use ICs, are externally connected to the pixel portion.

On the other hand, TFTs formed by a polycrystalline silicon thin film are higher in operational speed than TFTs formed by an amorphous silicon thin film. In this regard, there have been proposed FPDs such as liquid crystal display panels of a type in which scanning portions such as a horizontal scanning circuit portion and a vertical scanning circuit portion are formed by using TFTs formed by a polycrystalline silicon thin film and also a pixel portion is formed by using TFTs formed by the polycrystalline silicon thin film. With respect to the manufacture of liquid crystal display panels using TFTs formed by a polycrystalline silicon thin film as switching elements, there has been developed a technique of annealing an amorphous silicon thin film by irradiation of a pulse laser having an ultraviolet wavelength region such as an excimer laser, thereby crystallizing the amorphous silicon thin film.

Such a known laser annealing method generally involves irradiating an amorphous silicon thin film with a linear laser beam having a width less than 800 $\mu$m by several shots at each location by moving the laser beam relative to the amorphous silicon thin film, to anneal overall the amorphous silicon thin film, thereby crystallizing the amorphous silicon thin film.

This laser annealing method, however, has a problem that since the linear laser beam having a width less than 800 $\mu$m is used, not only the throughput is low but also crystal grains become uneven at adjacent laser irradiation portions.

To solve the problem caused by using a linear laser beam, there have been proposed methods of annealing overall an amorphous silicon thin film by using a large-area laser beam, thereby crystallizing the amorphous silicon thin film (for example, "Comparison of Effects Between Large-Area-Beam ELA and SPC on TFT Characteristics", 1996 IEEE p1454~, and "1 Hz/15 Joules-excimer laser development for flat display applications", SID '99 Conference). However, it has been actually impossible to crystallize, using a large-area laser beam, a large-area amorphous silicon thin film having a size of 10 inches or more by annealing from the viewpoints of energy density required for crystallization and load of an optical system.

SUMMARY OF THE INVENTION

An object of the present invention is to provide a method of capable of producing, at a high throughput, a large-area liquid crystal display panel having a horizontal scanning circuit portion including a TFT characteristic having a high drive current (high mobility), and a pixel portion and a vertical scanning circuit portion each of which contains crystal grains excellent in uniformity.

To achieve the above object, according to the present invention, there is provided a method of producing a FPD such as a liquid crystal display panel or O-ELD, including the steps of: irradiating a location, in which a horizontal scanning circuit portion is to be formed, of an amorphous silicon thin film panel to be crystallized with a specific number of shots of a laser beam having a uniform energy density distribution and having a rectangular shape of a long-side larger than a width of the amorphous silicon thin film panel and a short-side larger than a short-side of the horizontal scanning circuit portion, in a state in which a relative positional relationship between the amorphous silicon thin film panel and the laser beam is fixed; and irradiating a location, in which a vertical scanning circuit portion and a pixel portion are to be formed, of the amorphous silicon thin film panel with the laser beam while moving the laser beam relative to the amorphous silicon thin film panel along the length direction of the amorphous silicon thin film panel.

With this configuration, since laser annealing is performed by using the laser beam having a uniform energy density distribution and having a rectangular shape of a long-side larger than a width of the amorphous silicon thin film panel to be crystallized and a short-side larger than a short-side of the horizontal scanning circuit portion, it is possible to anneal the horizontal scanning circuit portion by the laser beam without the need of moving the laser beam relative to the horizontal scanning circuit portion, and hence to prevent crystal grains in the horizontal scanning circuit portion from becoming uneven. Also, since the location, in which the horizontal scanning circuit portion is to be formed, of the amorphous silicon thin film panel is annealed by irradiating the location with the specific number of shots of the laser beam in the state in which the relative positional relationship between the amorphous silicon thin film portion and the laser beam is fixed, it is possible to produce crystal grains having large grain sizes in the horizontal scanning circuit portion, and hence to form TFTs having a high mobility in the horizontal scanning circuit portion. Further, since the pixel portion and the vertical scanning circuit portion, which do not require a TFT characteristic having a high mobility comparable to that required for the horizontal scanning circuit portion, are formed by irradiating the amorphous silicon thin film panel with the laser beam while moving the laser beam relative to the amorphous silicon thin film along the length direction of the amorphous silicon thin film panel, it is possible to produce crystal grains having grain sizes which are small and less varied while preventing the crystal grains from becoming uneven in the transverse direction of the amorphous silicon thin film panel, and hence to form TFTs having uniform threshold values in the pixel portion and vertical scanning circuit portion.

In one preferred mode of the present invention, the amorphous silicon thin film panel is irradiated with the laser beam while the laser beam is moved relative to the amorphous silicon thin film panel along the length direction of the amorphous silicon thin film panel for each shot of the laser beam, to form the pixel portion and the vertical scanning circuit portion.

In another preferred mode, the laser beam and the amorphous silicon thin film panel are moved relative to each other so that adjacent two of areas, irradiated with the laser beam continuously emitted, of the amorphous silicon thin film panel are overlapped to each other in the length direction of the amorphous silicon thin film panel.

In a further preferred mode, the laser beam and the amorphous silicon thin film panel are moved relative to each other so that adjacent two of areas, irradiated with the laser beam continuously emitted, of the amorphous silicon thin film panel are 50% or more overlapped to each other in the length direction of the amorphous silicon thin film panel.

In a still further preferred mode, the amorphous silicon thin film panel is irradiated with a laser beam having an energy density smaller than that of the laser beam used for forming the horizontal scanning circuit portion while the laser beam is moved relative to the amorphous silicon thin film panel along the length direction of the amorphous silicon thin film panel, to form the pixel portion and the vertical scanning circuit portion.

Additionally, the energy density of the laser beam may be lowered by reducing the power of the laser beam emitted from a laser light source, or optically enlarging a width in the short-side direction of the rectangular laser beam.

The width in the short-side direction of the rectangular laser beam is preferably enlarged by using a slit.

The laser beam and the amorphous silicon thin film panel may be moved relative to each other by moving the amorphous silicon thin film panel, or by moving an optical system used for irradiating the amorphous silicon thin film panel with the laser beam.

The energy density of the laser beam may be in a range of 150 to 900 mJ/cm$^2$, preferably, 300 to 750 mJ/cm$^2$, more preferably, 450 to 600 mJ/cm$^2$.

In the case of using the laser beam having an energy density of 450 to 600 mJ/cm$^2$, the specific number of shots may be in a range of 2 to 60, preferably, 5 to 40, more preferably, 10 to 30.

The laser beam may be an excimer laser beam.

The excimer laser may be selected from a group consisting of an XeCl excimer laser having a resonance wavelength of 308 nm, a KrF excimer laser having a resonance wavelength of 248 nm, and an ArF excimer laser having a resonance wavelength of 193 nm.

DETAILED DESCRIPTION OF THE PREFERRED EMBODIMENT

Hereinafter, one preferred embodiment of the present invention will be described in detail with reference to the accompanying drawings.

Figure 1:
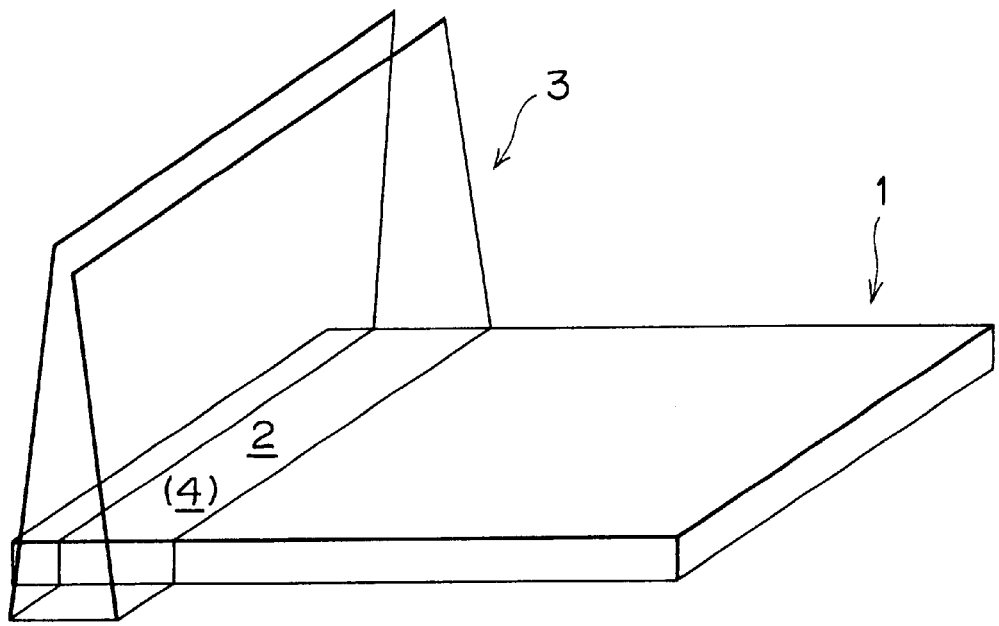
FIG. 1 is a view illustrating one step of producing a liquid crystal display panel according to a preferred embodiment of the present invention, showing a state that a region, in which a horizontal scanning circuit portion is to be formed, of an amorphous silicon thin film panel is irradiated with an XeCl excimer laser beam.
Figure 2:
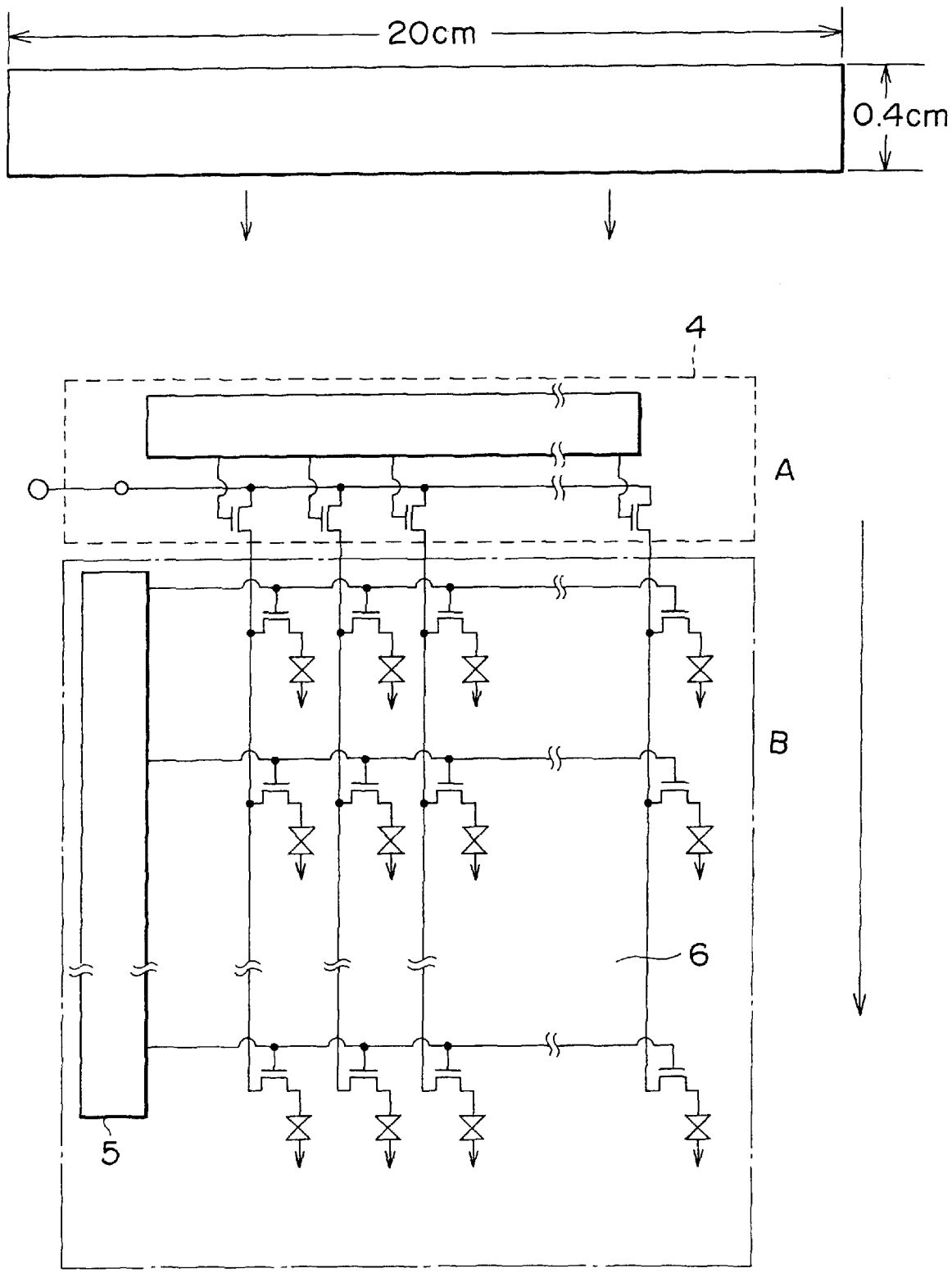
FIG. 2 is a schematic plan view of a liquid crystal display panel to be produced by the method of producing a liquid crystal display panel according to the preferred embodiment of the present invention.

FIG. 1 is a view illustrating one step of producing a liquid crystal display panel according a preferred embodiment of the present invention, and FIG. 2 is a schematic plan view of a liquid crystal display panel to be produced by the method of producing a liquid crystal display panel according to the preferred embodiment of the present invention.

Referring to FIG. 1, an amorphous silicon thin film panel 1 is prepared by forming a hydrogenated amorphous silicon thin film on a glass sheet (not shown) and dehydrogenating the hydrogenated amorphous silicon thin film, and a region 2, in which a horizontal scanning circuit portion and a peripheral circuit portion (hereinafter, referred to as "horizontal scanning circuit equivalent portion") are to be formed, of the amorphous silicon thin film panel 1 is irradiated with a rectangular XeCl excimer laser beam (resonance wavelength: 308 nm) 3 having an energy density of 450 to 600 mJ/cm$^2$.

Referring to FIG. 2, according to this embodiment, the XeCl excimer laser beam 3 is shaped by an optical system (not shown) into a rectangular shape having a short-side larger than a short-side of the horizontal scanning circuit equivalent portion designated by reference numeral 4 and a long-side larger than a width of the amorphous silicon thin film panel 1, that is, in such a manner as to cover the region 2, in which the horizontal scanning circuit equivalent portion 4 is to be formed, of the amorphous silicon thin film panel 1. The XeCl excimer laser beam 3 is typically shaped into a rectangular shape of 0.4 cm×20 cm.

First, the region 2, in which the horizontal scanning circuit equivalent portion 4 is to be formed, of the amorphous silicon thin film panel 1 is irradiated with 10 to 30 shots of the rectangular XeCl excimer laser beam 3 having an energy density of 450 to 600 mJ/cm$^2$, to form the horizontal scanning circuit equivalent portion 4.

Upon formation of the horizontal scanning circuit equivalent portion 4 by laser annealing, the amorphous silicon thin film panel 1 is held in the stationary state, to fix a relative positional relationship between the XeCl excimer laser beam 3 and the amorphous silicon thin film panel 1. In this way, the total laser energy of 4.5 to 18 J/cm$^2$ is given to the region 2, in which the horizontal scanning circuit equivalent portion 4 is to be formed, of the amorphous silicon thin film panel 1.

As a result, amorphous silicon in the region 2, in which the horizontal scanning circuit equivalent portion 4 is to be formed, of the amorphous silicon thin film panel 1 is crystallized. At this time, since the region 2 is annealed by irradiation of 10 to 30 shots of the rectangular XeCl excimer laser beam 3 having a high energy density, the grain sizes of crystals thus produced become large. Accordingly, the horizontal scanning circuit equivalent portion 4 having the horizontal scanning circuit portion which includes TFTs having a high mobility, that is, a high drive current characteristic, is formed.

Figure 3:
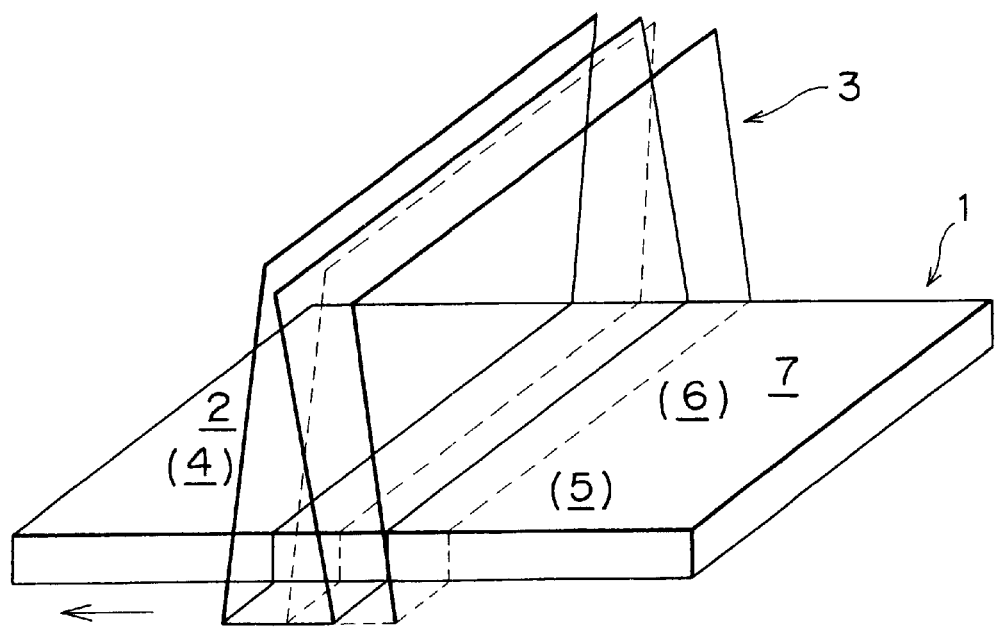
FIG. 3 is a view illustrating another step of producing the liquid crystal display panel according to the preferred embodiment of the present invention, showing a state that a region, in which a vertical scanning circuit portion and a pixel portion are to be formed, of the amorphous silicon thin film panel is irradiated with the XeCl excimer laser beam.

FIG. 3 is a view illustrating another step of producing the liquid crystal display panel according to the preferred embodiment of the present invention, showing a state that a region 7, in which a vertical scanning circuit portion 5 and a pixel portion 6 are to be formed, of the amorphous silicon thin film panel 1 is irradiated with the XeCl excimer laser beam 3.

Referring to FIG. 3, the irradiation of the region 7, in which the vertical scanning circuit portion 5 and the pixel portion 6 are to be formed, of the amorphous silicon thin film panel 1 with the XeCl excimer laser beam 3 is performed by moving the amorphous silicon thin film panel 1 in the length direction thereof for each shot of the laser beam 3 by using a moving mechanism (not shown) so that adjacent two of areas, irradiated with the laser beam 3 continuously emitted, of the amorphous silicon thin film panel 1 are 50% overlapped to each other in the length direction of the amorphous silicon thin film panel 1.

As a result, amorphous silicon in the region 7, in which the vertical scanning circuit portion 5 and the pixel portion 6 are to be formed, of the amorphous silicon thin film panel 1 is crystallized. At this time, each area of the region 7 is irradiated with two shots of the laser beam 3, to be crystallized. Accordingly, since the laser energy given to the region 7 is very smaller than that given to the region 2 in which the horizontal scanning circuit portion 4 is to be formed, the crystal grains produced in the region 7 become smaller as compared with the crystal grains produced in the region 2. As a result, the vertical scanning circuit portion 5 and the pixel portion 6, each of which includes TFTs having a small drive current, that is, a low mobility but containing crystal grains whose sizes are uniform, are formed. It should be noted that although the mobility characteristic, that is, the drive current characteristic of the vertical scanning circuit portion 5 becomes low, there is no problem because the vertical scanning circuit portion 5 does not require a high mobility characteristic, that is, a high drive current characteristic comparable to that required for the horizontal scanning circuit portion.

Further, since the amorphous silicon thin film panel 1 is moved in the length direction thereof for each shot of the XeCl excimer laser beam 3 by using the moving mechanism (not shown) so that adjacent two of areas, irradiated with the laser beam 3 continuously emitted, of the amorphous silicon thin film panel 1 are 50% overlapped to each other in the length direction of the amorphous silicon thin film panel 1, the laser energy given to the region 7 in which the vertical scanning circuit portion 5 and the pixel portion 6 are to be formed becomes uniform, whereby TFTs containing crystal grains whose sizes are uniform are formed overall in the vertical scanning circuit portion 5 and the pixel portion 6.

The formation of the horizontal scanning circuit equivalent portion 4, the vertical scanning circuit portion 5, and the pixel portion 6 is followed by the usual steps of forming islands, a gate oxide film, source/drains, interlayer insulating film, contact holes, metal wiring, and ITO, and further the step of injecting liquid crystal. In this way, a liquid crystal display panel is produced.

According to this embodiment, the horizontal scanning circuit equivalent portion 4 including the horizontal scanning circuit portion requiring a high mobility characteristic, that is, a high drive current characteristic is formed by irradiating the portion 4 with 10 to 30 shots of the rectangular XeCl excimer laser beam 3 having an energy density of 450 to 600 mJ/cm$^2$ while holding the amorphous silicon thin film panel 1 in the stationary state, and accordingly, it is possible to form the horizontal scanning circuit portion including TFTs containing crystal grains having large grain sizes and thereby having a high mobility characteristic, that is, a high drive current characteristic. Meanwhile, the vertical scanning circuit portion 5 and the pixel portion 6, each of which requires the formation of uniform crystal grains in preference to a high mobility characteristic, that is, a high drive current characteristic, are formed by moving the amorphous silicon thin film panel 1 in the length direction thereof for each shot of the XeCl excimer laser beam 3 by the moving mechanism (not shown) so that adjacent two of areas, irradiated with the laser beam 3 continuously emitted, of the amorphous silicon thin film panel 1 are 50% overlapped to each other in the length direction of the amorphous silicon thin film panel 1, and accordingly, the vertical scanning circuit portion 5 and the pixel portion 6, each of which includes TFTs containing crystal grains whose sizes are small but are uniform, can be formed.

According to this embodiment, the vertical scanning circuit portion 5 and the pixel portion 6 are formed by moving the amorphous silicon thin film panel 1 in the length direction thereof for each shot of the XeCl excimer laser beam 3 by the moving mechanism (not shown) so that adjacent two of areas, irradiated with the laser beam 3 continuously emitted, of the amorphous silicon thin film panel 1 are 50% overlapped to each other in the length direction of the amorphous silicon thin film panel 1, and accordingly, the laser energy given to the region 7, in which the vertical scanning circuit portion 5 and the pixel portion 6 are to be formed, becomes uniform. As a result, it is possible to form TFTs containing crystal grains whose sizes are uniform overall in the vertical scanning circuit portion 5 and the pixel portion 6.

According to this embodiment, the horizontal scanning circuit equivalent portion 4 is formed by irradiating the portion 4 with the rectangular XeCl excimer laser beam 3 while holding the amorphous silicon thin film panel 1 in the stationary state, and the vertical scanning circuit portion 5 and the pixel portion 6 are formed by moving the amorphous silicon thin film panel 1 in the length direction thereof for each shot of the XeCl excimer laser beam 3 by the moving mechanism (not shown) so that adjacent two of areas, irradiated with the laser beam 3 continuously emitted, of the amorphous silicon thin film panel 1 are 50% overlapped to each other in the length direction of the amorphous silicon thin film panel 1, and accordingly, the optical system remains fixed at respective steps. As a result, it is possible to produce the liquid crystal display panel at a good throughput.

The present invention will be more clearly understood by way of the following examples:

EXAMPLE 1

A passivation film made from $SiO_2/SiN$ (30 nm/10 nm) for preventing contamination due to glass was formed on a glass sheet having a size of 100 cm×100 cm (thickness: 1000 μm.

A hydrogenated amorphous silicon film was deposited on the passivation film by a CVD process, and was held in a nitrogen atmosphere chamber at 450° C. for 2 hr, to be dehydrogenated, whereby an amorphous silicon film having a thickness of 40 nm was formed.

An XeCl excimer laser (resonance wavelength: 308 nm) having an output of 1 J or more and a frequency of 1 Hz or more, which was pumped by an X-ray preliminary ionization method, was shaped into an XeCl excimer laser beam having a size of 0.5 cm×30 cm and having an energy density of 550 $mJ/cm^2$ by using an optical system. A region, in which a horizontal scanning circuit portion was to be formed, of the amorphous silicon film was irradiated with 20 shots of the above XeCl excimer laser beam, to form the horizontal scanning circuit portion.

After the glass sheet was moved by a moving mechanism, the XeCl excimer laser beam was reshaped into an XeCl excimer laser beam having a size of 4 cm×30 cm and simultaneously the energy density of the laser beam was reduced to 450 $mJ/cm^2$ by using a slit, and was further reshaped into an XeCl excimer laser beam having a width of about 2 cm by using a slit. A region, in which a vertical scanning circuit portion and a pixel portion were to be formed, of the amorphous silicon thin film, was irradiated with the above XeCl excimer laser beam, to form the vertical scanning circuit portion and the pixel portion. In this case, the glass sheet is moved in the length direction thereof for each shot of the XeCl laser beam by the moving mechanism so that adjacent two of areas, irradiated with the laser beam, of the amorphous silicon thin film are 50% overlapped to each other in the length direction of the amorphous silicon thin film.

As a result of analysis of the crystallized silicon thin film, it was revealed that in the horizontal scanning circuit portion, crystal grains whose sizes were in a range of 1 μm or more were produced, and thereby TFTs having a high mobility characteristic, that is, a high drive current characteristic was formed, and that in the vertical scanning circuit portion and pixel portion, crystal grains whose sizes were small but less varied were produced, and thereby TFTs containing uniform crystal grains were formed.

EXAMPLE 2

The same procedure as that in Example 1 was repeated except that the number of shots was variously changed. Sizes of crystal grains in each of the crystallized silicon thin films thus obtained were measured.

Figure 4:
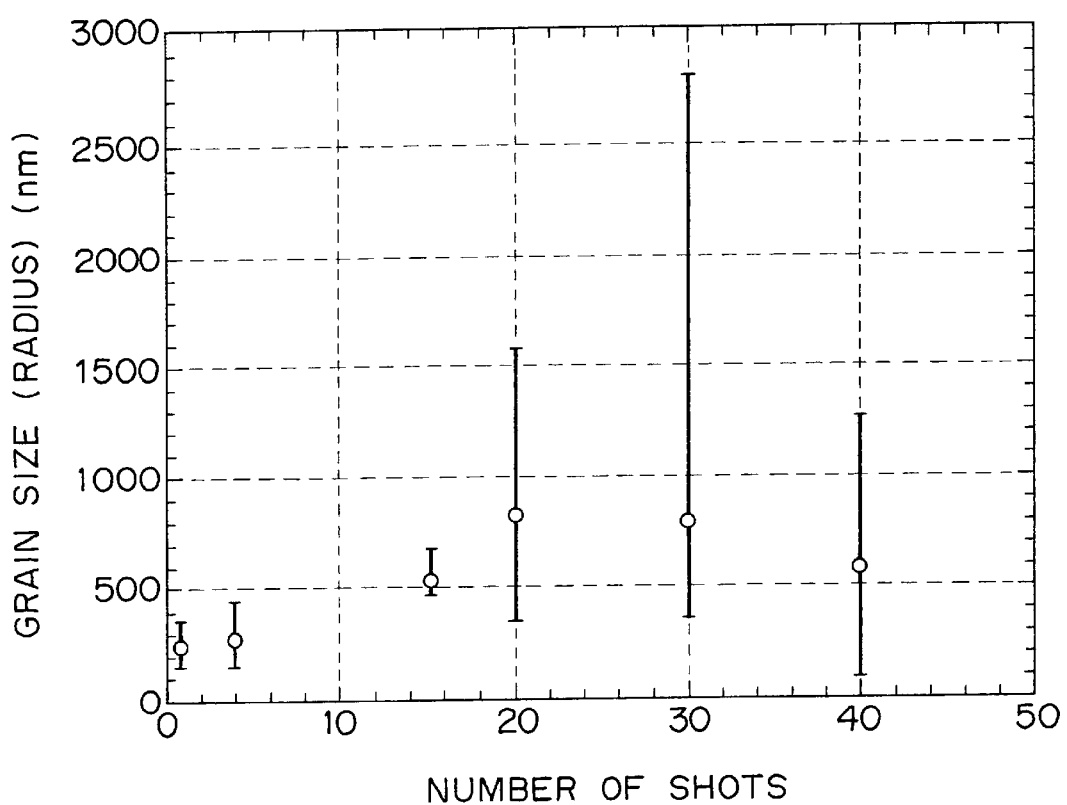
FIG. 4 is a graph showing a relationship between the number of shots of a laser beam and sizes of crystal grains.

The results are shown in FIG. 4.

As is apparent from FIG. 4, as the number of shots becomes larger, the sizes of crystal grains become larger but variations in grain size become larger, with a result that TFTs excellent in uniformity cannot be obtained. On the other hand, as the number of shots becomes smaller, the sizes of crystal grains become small but the variations in grain size become smaller, with a result that TFTs excellent in uniformity can be obtained.

While the preferred embodiment of the present invention has been described by way of the examples, such a description is for illustrative purposes only, and it is to be understood that changes and variations may be made without departing from the spirit or scope of the claims.

For example, the XeCl excimer laser having a resonance wavelength of 308 nm is used in the embodiment and the examples; however it may be replaced with a KrF (resonance wavelength: 248 nm) excimer laser or an ArF (resonance wavelength: 193 nm) excimer laser.

The XeCl excimer laser beam having an energy density in the range of 450 to 600 $mJ/cm^2$ is used in the embodiment; however, the present invention is not limited thereto. For example, an XeCl excimer laser beam having an energy density in a wider range of 300 to 750 $mJ/cm^2$, and further an XeCl excimer laser beam having an energy density in a still wider range of 150 to 900 $mJ/cm^2$ may be used.

The horizontal scanning circuit equivalent portion 4 is formed by irradiating the amorphous silicon thin film panel 1 with 10 to 30 shots of the rectangular XeCl excimer laser beam (resonance wavelength: 308 nm) having an energy density of 450 to 600 $mJ/cm^2$ in the embodiment; however, the present invention is not limited thereto. For example, the number of shots may be set in a wider range of 5 to 40, and further set in a still wider range of 2 to 60.

The XeCl excimer laser beam 3 is shaped into the rectangular shape having the size of 0.4 cm×20 cm in the embodiment; however, according to the present invention, the size of the XeCl excimer laser beam is not necessarily limited to 0.4 cm×20 cm insofar as the long-side of the laser beam is larger than the width of the amorphous silicon thin film panel 1 to be crystallized and the short-side of the laser beam is larger than the short-side of the horizontal scanning circuit portion.

In the embodiment and examples, the irradiation of the region 7, in which the vertical scanning circuit portion 5 and the pixel portion 6 are to be formed, of the amorphous silicon thin film panel 1 (or the amorphous silicon thin film) with the XeCl excimer laser beam 3 is performed by moving the amorphous silicon thin film panel 1 in the length direction thereof for each shot of the laser beam 3 so that adjacent two of areas, irradiated with the laser beam 3 continuously emitted, of the amorphous silicon thin film panel 1 are 50% overlapped to each other in the length direction of the amorphous silicon thin film panel 1. According to the present invention, however, the overlapped ratio is not necessarily limited to 50% insofar as the region 7, in which the vertical scanning circuit portion 5 and the pixel portion 6 are to be formed, of the amorphous silicon thin film panel 1 is uniformly irradiated with the laser beam 3. For example, the amorphous silicon thin film panel 1 may be moved in the length direction thereof for each shot of the excimer laser beam 3 so that adjacent two of areas, irradiated with the laser beam 3 continuously emitted, of the amorphous silicon thin film panel 1 are 50% or more (typically, ⅔=about 70%) overlapped to each other.

The vertical scanning circuit portion 5 and the pixel portion 6 are formed by using the excimer laser beam 3 having the same energy density as that of the excimer laser beam used for forming the horizontal scanning circuit equivalent portion 4 of the amorphous silicon thin film panel 1 (or amorphous silicon thin film) in the embodiment and examples; however, in formation of the vertical scanning circuit portion 5 and the pixel portion 6, the energy density of the laser beam 3 may be lowered in accordance with the necessary sizes of crystal grains in the vertical scanning portion 5 and the pixel portion 6, for example, by enlarging the beam area of the excimer laser beam 3 with the aid of an optical system such as a slit, by reducing the power of the excimer laser beam 3 through the external adjustment of a laser oscillation voltage, or by enlarging the beam area of the excimer laser beam 3 and simultaneously reducing the power of the excimer laser beam with the aid of an optical system such as a slit.

The amorphous silicon thin film panel 1 (or glass sheet) is moved to form the vertical scanning circuit portion 5 and the pixel portion 6 in the embodiment and examples; however, according to the present invention, the excimer laser beam 3 and the amorphous silicon thin film panel 1 (or glass sheet) may be moved relative to each other in such a manner as to irradiate the amorphous silicon thin film panel 1 with the laser beam 3. For example, the optical system for irradiation of the laser beam 3 may be moved in place of moving the amorphous silicon thin film panel 1 (or glass sheet).

The beam area of the excimer laser beam 3 is enlarged by using a slit in the examples; however, such a slit may be replaced with another known optical means.

The amorphous silicon thin panel 1 (or glass sheet) is held in the stationary state in the embodiment and examples; however, it is not necessarily held in the stationary state insofar as a relative positional relationship between the XeCl excimer laser beam 3 and the amorphous silicon thin film panel 1 (or glass sheet) is fixed.

A glass sheet is used as a substrate in the examples, it may be replaced with a plastic substrate.

As described above, according to the present invention, it is possible to provide the method capable of producing, at a high throughput, a large-area liquid crystal display panel having a horizontal scanning circuit portion including a TFT characteristic having a high drive current (a high mobility), and a pixel portion and a vertical scanning circuit portion each of which contains crystal grains excellent in uniformity.

What is claimed is:

1. A method of producing a liquid crystal display panel, comprising the steps of:

irradiating a location, in which a horizontal scanning circuit portion is to be formed, of an amorphous silicon thin film panel to be crystallized with a specific number of shots of a laser beam having a uniform energy density distribution and having a rectangular shape of a long-side larger than a width of said amorphous silicon thin film panel and a short-side larger than a short-side of said horizontal scanning circuit portion, in a state in which a relative positional relationship between said amorphous silicon thin film panel and said laser beam is fixed; and irradiating a location, in which a vertical scanning circuit portion and a pixel portion are to be formed, of said amorphous silicon thin film panel with said laser beam while moving said laser beam relative to said amorphous silicon thin film panel along the length direction of said amorphous silicon thin film panel.

2. A method of producing a liquid crystal display panel according to claim 1, wherein said amorphous silicon thin film panel is irradiated with said laser beam while said laser beam is moved relative to said amorphous silicon thin film panel along the length direction of said amorphous silicon thin film panel for each shot of said laser beam, to form said pixel portion and said vertical scanning circuit portion.

3. A method of producing a liquid crystal display panel according to claim 1, wherein said laser beam and said amorphous silicon thin film panel are moved relative to each other so that adjacent two of areas, irradiated with said laser beam continuously emitted, of said amorphous silicon thin film panel are overlapped to each other in the length direction of said amorphous silicon thin film panel.

4. A method of producing a liquid crystal display panel according to claim 3, wherein said laser beam and said amorphous silicon thin film panel are moved relative to each other so that adjacent two of areas, irradiated with said laser beam continuously emitted, of said amorphous silicon thin film panel are 50% or more overlapped to each other in the length direction of said amorphous silicon thin film panel.

5. A method of producing a liquid crystal display panel according to claim 1, wherein said amorphous silicon thin film panel is irradiated with a laser beam having an energy density smaller than that of said laser beam used for forming said horizontal scanning circuit portion while said laser beam is moved relative to said amorphous silicon thin film panel along the length direction of said amorphous silicon thin film panel, to form said pixel portion and said vertical scanning circuit portion.

6. A method of producing a liquid crystal display panel according to claim 5, wherein the energy density of said laser beam is lowered by reducing the power of said laser beam emitted from a laser light source.

7. A method of producing a liquid crystal display panel according to claim 5, wherein the energy density of said laser beam is lowered by optically enlarging a width in the short-side direction of said rectangular laser beam.

8. A method of producing a liquid crystal display panel according to claim 7, wherein the width in the short-side direction of said rectangular laser beam is enlarged by using a slit.

9. A method of producing a liquid crystal display panel according to claim 1, wherein said laser beam and said amorphous silicon thin film panel are moved relative to each other by moving said amorphous silicon thin film panel.

10. A method of producing a liquid crystal display panel according to claim 1, wherein said laser beam and said amorphous silicon thin film panel are moved relative to each other by moving an optical system used for irradiating said amorphous silicon thin film panel with said laser beam.

11. A method of producing a liquid crystal display panel according to claim 1, wherein the energy density of said laser beam is in a range of 150 to 900 mJ/cm$^2$.

12. A method of producing a liquid crystal display panel according to claim 11, wherein the energy density of said laser beam is in a range of 300 to 750 mJ/cm$^2$.

13. A method of producing a liquid crystal display panel according to claim 12, wherein the energy density of said laser beam is in a range of 450 to 600 mJ/cm$^2$.

14. A method of producing a liquid crystal display panel according to claim 1, wherein said specific number of shots is in a range of 2 to 60.

15. A method of producing a liquid crystal display panel according to claim 14, wherein said specific number of shots is in a range of 5 to 40.

16. A method of producing a liquid crystal display panel according to claim 15, wherein said specific number of shots is in a range of 10 to 30.

17. A method of producing a liquid crystal display panel according to claim 1, wherein said laser beam is an excimer laser beam.

18. A method of producing a liquid crystal display panel according to claim 17, wherein said excimer laser is selected from a group consisting of an XeCl excimer laser having a resonance wavelength of 308 nm, a KrF excimer laser having a resonance wavelength of 248 nm, and an ArF excimer laser having a resonance wavelength of 193 nm.

* * * * *